(12) United States Patent
Khlat

(10) Patent No.: US 10,103,926 B1
(45) Date of Patent: Oct. 16, 2018

(54) MULTI-MODE POWER MANAGEMENT CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/825,562

(22) Filed: Nov. 29, 2017

Related U.S. Application Data

(60) Provisional application No. 62/542,366, filed on Aug. 8, 2017.

(51) Int. Cl.
*H04L 27/34* (2006.01)
*H04L 27/36* (2006.01)

(52) U.S. Cl.
CPC ........ *H04L 27/3405* (2013.01); *H04L 27/362* (2013.01); *H04L 2463/103* (2013.01)

(58) Field of Classification Search
CPC ............... H04L 27/3405; H04L 27/362; H04L 2463/103
See application file for complete search history.

(56) References Cited

U.S. PATENT DOCUMENTS

| | | | |
|---|---|---|---|
| 6,434,122 B2 * | 8/2002 | Barabash | H04B 1/52 370/277 |
| 8,008,970 B1 | 8/2011 | Homol et al. | |
| 8,909,175 B1 * | 12/2014 | McCallister | H04L 27/368 330/127 |
| 9,484,865 B2 | 11/2016 | Kobayashi et al. | |
| 2006/0244513 A1 | 11/2006 | Yen et al. | |
| 2009/0045877 A1 | 2/2009 | Wang et al. | |
| 2010/0219887 A1 | 9/2010 | Ichitsubo et al. | |
| 2010/0283534 A1 | 11/2010 | Pierdomenico | |
| 2013/0165132 A1 * | 6/2013 | Goedken | H04W 52/243 455/450 |

(Continued)

OTHER PUBLICATIONS

U.S. Appl. No. 15/678,245, filed Aug. 16, 2017.

(Continued)

*Primary Examiner* — Freshteh N Aghdam
(74) *Attorney, Agent, or Firm* — Withrow & Terranova, P.L.L.C.

(57) ABSTRACT

A multi-mode power management circuit is provided. The multi-mode power management circuit includes an unlicensed band amplifier circuit configured to amplify a radio frequency (RF) signal for transmission in an unlicensed RF band(s). In examples described herein, the unlicensed RF band(s) resides in the 5 GHz RF spectrum and is shared between long-term evolution (LTE) enhanced licensed assisted access (eLAA) and Wi-Fi® connectivity. In addition, the multi-mode power management circuit can also support LTE communication in a licensed RF band(s). The multi-mode power management circuit can be dynamically and flexibly configured to support a variety of eLAA, Wi-Fi®, and LTE communication scenarios (e.g., uplink carrier aggregation) in licensed and/or unlicensed RF band(s) based on such power management schemes as envelope tracking (ET). In this regard, the multi-mode power management circuit can support eLAA, Wi-Fi®, and LTE convergence in a mobile device without compromising power management efficiency and/or increasing footprint.

20 Claims, 4 Drawing Sheets

(56) References Cited

U.S. PATENT DOCUMENTS

| | | | |
|---|---|---|---|
| 2013/0285750 A1* | 10/2013 | Chowdhury | H03F 1/0222 |
| | | | 330/296 |
| 2014/0105327 A1* | 4/2014 | Geng | H03F 1/025 |
| | | | 375/297 |
| 2015/0091653 A1 | 4/2015 | Kobayashi et al. | |
| 2016/0164476 A1* | 6/2016 | Wang | H03F 1/565 |
| | | | 330/250 |
| 2017/0124013 A1* | 5/2017 | Vaillancourt | G06F 13/4022 |

OTHER PUBLICATIONS

U.S. Appl. No. 15/720,894, filed Sep. 29, 2017.
U.S. Appl. No. 15/856,143, filed Dec. 28, 2017.
U.S. Appl. No. 15/830,686, filed Dec. 4, 2017.
U.S. Appl. No. 15/837,496, filed Dec. 11, 2017.
U.S. Appl. No. 15/836,334, filed Dec. 8, 2017.
Ex Parte Quayle Action for U.S. Appl. No. 15/678,245, mailed Jun. 6, 2018, 4 pages.
Notice of Allowance for U.S. Appl. No. 15/830,686, dated May 24, 2018, 8 pages.
Notice of Allowance for U.S. Appl. No. 15/837,496, dated May 25, 2018, 8 pages.

* cited by examiner

MULTI-MODE POWER MANAGEMENT CIRCUIT

RELATED APPLICATIONS

This application claims the benefit of provisional patent application Ser. No. 62/542,366, filed Aug. 8, 2017, the disclosure of which is hereby incorporated herein by reference in its entirety.

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Advanced wireless communication technologies defined by the third-generation partnership project (3GPP), such as long-term evolution (LTE) and fifth-generation new radio (5G-NR), are widely regarded as the foundations for future wireless communication systems. Conventionally, the LTE and the 5G-NR technologies are designed to operate in licensed radio frequency (RF) spectrums. However, as mobile technology users continue to grow and demand for higher data speeds continues to increase, the licensed RF spectrums become overcrowded and scarce.

To help ease overcrowding in the licensed RF spectrums, the 3GPP defined a new technical standard to allow mobile communication devices to communicate RF signals in unlicensed RF spectrums. More specifically, the 3GPP defined licensed assisted access (LAA) and enhanced LAA (eLAA) standards that enable mobile communication devices to receive and transmit in unlicensed 5 GHz RF spectrums in addition to the existing licensed RF spectrums. One such band defined by the 3GPP in the unlicensed RF spectrums is LTE band 46 (5150-5925 MHz). However, the unlicensed 5 GHz RF spectrums have also been widely used by the wireless communication devices to provide Wi-Fi® connectivity based on the Institute of Electrical and Electronics Engineers (IEEE) 802.11a, 802.11g, and 802.11ac standards. As such, it may be desirable for LTE, 5G-NR, LAA, eLAA, and Wi-Fi technologies to coexist in the mobile communication devices.

SUMMARY

Embodiments of the disclosure relate to a multi-mode power management circuit. The multi-mode power management circuit includes an unlicensed band amplifier circuit configured to amplify a radio frequency (RF) signal for transmission in an unlicensed RF band(s). In examples described herein, the unlicensed RF band(s) resides in the 5 GHz RF spectrum and is shared between long-term evolution (LTE) enhanced licensed assisted access (eLAA) and Wi-Fi® connectivity. In addition, the multi-mode power management circuit can also support LTE communication in a licensed RF band(s). The multi-mode power management circuit can be dynamically and flexibly configured to support a variety of eLAA, Wi-Fi®, and LTE communication scenarios (e.g., uplink carrier aggregation) in licensed and/or unlicensed RF band(s) based on such power management schemes as envelope tracking (ET). In this regard, the multi-mode power management circuit can support eLAA, Wi-Fi®, and LTE convergence in a mobile device without compromising power management efficiency and/or increasing footprint.

In one aspect, a multi-mode power management circuit is provided. The multi-mode power management circuit includes an unlicensed band amplifier circuit comprising a supply voltage input and configured to amplify an RF signal for transmission in at least one unlicensed RF band based on a supply voltage received at the supply voltage input. The multi-mode power management circuit also includes first tracker circuitry comprising a first voltage output and configured to generate a first modulated voltage at the first voltage output. The multi-mode power management circuit also includes second tracker circuitry comprising a second voltage output and configured to generate a second modulated voltage at the second voltage output. The multi-mode power management circuit also includes supply voltage circuitry comprising a plurality of supply voltage outputs configured to output a plurality of supply voltages, respectively. The multi-mode power management circuit also includes control circuitry configured to support a first transmission mode and a second transmission mode. In the first transmission mode, the control circuitry is further configured to couple a selected voltage output among the first voltage output and the second voltage output to the supply voltage input to provide a selected modulated voltage among the first modulated voltage and the second modulated voltage to the unlicensed band amplifier circuit. In the second transmission mode, the control circuitry is further configured to couple a selected supply voltage output among the plurality of supply voltage outputs to the supply voltage input to provide a selected supply voltage among the plurality of supply voltages to the unlicensed band amplifier circuit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
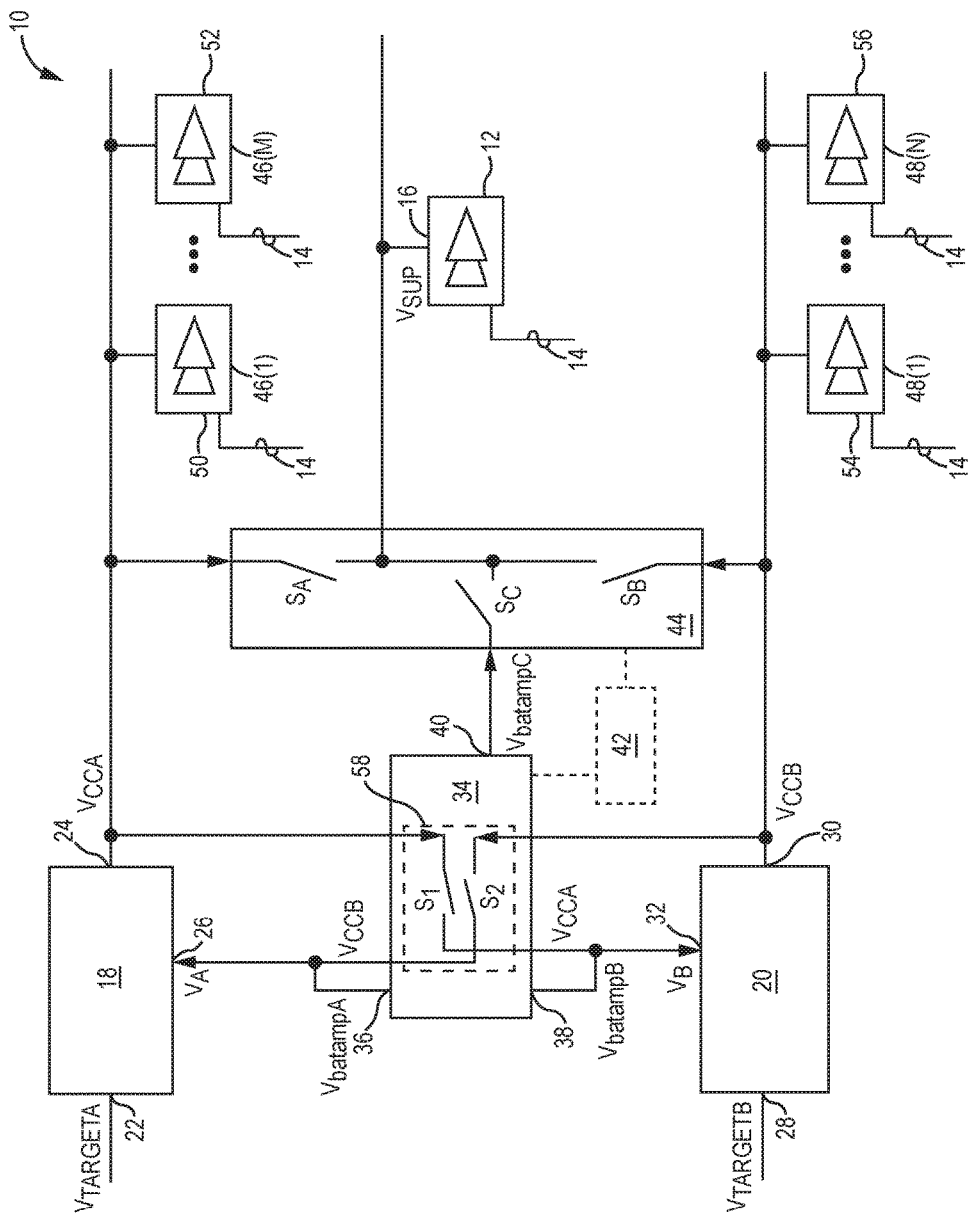
FIG. 1 is a schematic diagram of an exemplary multi-mode power management circuit configured to provide a flexible power management architecture to enable enhanced licensed assisted access (eLAA), Wi-Fi®, and long-term evolution (LTE) convergence in a mobile device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multi-mode power management circuit. The multi-mode power management circuit includes an unlicensed band amplifier circuit configured to amplify a radio frequency (RF) signal for transmission in an unlicensed RF band(s). In examples described herein, the unlicensed RF band(s) resides in the 5 GHz RF spectrum and is shared between long-term evolution (LTE) enhanced licensed assisted access (eLAA) and Wi-Fi® connectivity. In addition, the multi-mode power management circuit can also support LTE communication in a licensed RF band(s). The multi-mode power management circuit can be dynamically and flexibly configured to support a variety of eLAA, Wi-Fi®, and LTE communication scenarios (e.g., uplink carrier aggregation) in licensed and/or unlicensed RF band(s) based on such power management schemes as envelope tracking (ET). In this regard, the multi-mode power management circuit can support eLAA, Wi-Fi®, and LTE convergence in a mobile device without compromising power management efficiency and/or increasing footprint.

In this regard, FIG. 1 is a schematic diagram of an exemplary multi-mode power management circuit 10 configured to provide a flexible power management architecture to enable eLAA, Wi-Fi®, and LTE convergence in a mobile device. In examples discussed herein, Wi-Fi® refers in general to wireless connectivity technologies based on standards defined by the Institute of Electrical and Electronics Engineers (IEEE) and/or Wi-Fi Alliance™. In a non-limiting example, Wi-Fi® herein refers to wireless connectivity in an unlicensed 5 GHz RF spectrum based on IEEE 802.11a, 802.11g, 802.11n, 802.11ac, and any future standard involving the unlicensed 5 GHz spectrum.

The multi-mode power management circuit 10 includes an unlicensed band amplifier circuit 12 configured to amplify an RF signal 14 for transmission in at least one unlicensed RF band. In a non-limiting example, the unlicensed band amplifier circuit 12 is configured to amplify the RF signal 14 for transmission in LTE band 46 (5150-5925 MHz) (hereinafter referred to as "eLAA band") or in any unlicensed Wi-Fi 5 GHz band (hereinafter referred to as "WiFi-5G band") as permitted by regulatory authorities around the world. In this regard, the unlicensed band amplifier circuit 12 is configured to operate in a first transmission mode when amplifying the RF signal 14 for transmission in the eLAA band and operate in a second transmission mode when amplifying the RF signal 14 for transmission in the RiFi-5G band.

The unlicensed band amplifier circuit 12 includes a supply voltage input 16 configured to receive a supply voltage $V_{SUP}$. The unlicensed band amplifier circuit 12 is further configured to amplify the RF signal 14 in the first transmission mode and the second transmission mode based on the supply voltage $V_{SUP}$ received via the supply voltage input 16. In a non-limiting example, the unlicensed band amplifier circuit 12 can receive the supply voltage $V_{SUP}$, can be an ET modulated voltage in the first transmission mode, and receive the supply voltage $V_{SUP}$ as a non-modulated voltage in the second transmission mode.

The multi-mode power management circuit 10 includes first tracker circuitry 18 and second tracker circuitry 20. The first tracker circuitry 18 includes a first voltage input 22, a first voltage output 24, and a first bias voltage input 26. The first tracker circuitry 18 is configured to receive a first target voltage $V_{TARGETA}$ at the first voltage input 22 and generate a first modulated voltage $V_{CCA}$ at the first voltage output 24. In a non-limiting example, the first target voltage $V_{TARGETA}$ is an ET modulated target voltage that defines a time-variant voltage envelope. Accordingly, the first modulated voltage $V_{CCA}$ is an ET modulated voltage that tracks the time-variant voltage envelope of the first target voltage $V_{TARGETA}$. The first tracker circuitry 18 receives a first bias voltage $V_A$ at the first bias voltage input 26. In a non-limiting example, the first bias voltage $V_A$ determines peak amplitude of the first modulated voltage $V_{CCA}$.

Similarly, the second tracker circuitry 20 includes a second voltage input 28, a second voltage output 30, and a second bias voltage input 32. The second tracker circuitry 20 is configured to receive a second target voltage $V_{TARGETB}$ at the second voltage input 28 and generate a second modulated voltage $V_{CCB}$ at the second voltage output 30. In a non-limiting example, the second target voltage $V_{TARGETB}$ is an ET modulated target voltage that defines a time-variant voltage envelope. Accordingly, the second modulated voltage $V_{CCB}$ is an ET modulated voltage that tracks the time-variant voltage envelope of the second target voltage $V_{TARGETA}$. The second tracker circuitry 20 receives a second bias voltage $V_B$ at the second bias voltage input 32. In a non-limiting example, the second bias voltage $V_B$ determines peak amplitude of the second modulated voltage $V_{CCB}$.

The multi-mode power management circuit 10 includes supply voltage circuitry 34. The supply voltage circuitry 34 includes a first supply voltage output 36, a second supply voltage output 38, and a third supply voltage output 40. Notably, the supply voltage circuitry 34 may be configured to include additional supply voltage outputs as necessary. The first supply voltage output 36, the second supply voltage output 38, and the third supply voltage output 40 are configured to output a first supply voltage $V_{batampA}$, a second supply voltage $V_{batampB}$, and a third supply voltage $V_{batampC}$, respectively. As is further discussed below, the first supply voltage $V_{batampA}$, the second supply voltage $V_{batampB}$, and the third supply voltage $V_{batampC}$ can either be independently or concurrently generated at various voltage levels according to various usage scenarios.

The multi-mode power management circuit 10 includes control circuitry 42, which can be a microprocessor, a microcontroller, or a field-programmable gate array (FPGA) for example. The control circuitry 42 controls the supply voltage circuitry 34 to provide appropriate level of supply voltage to the supply voltage input 16 of the unlicensed band amplifier circuit 12 in the first transmission mode and the second transmission mode.

In the first transmission mode, the control circuitry 42 may couple a selected voltage output among the first voltage output 24 and the second voltage output 30 to the supply voltage input 16 to provide a selected modulated voltage among the first modulated voltage $V_{CCA}$ and the second modulated voltage $V_{CCB}$ to the unlicensed band amplifier circuit 12. For example, the control circuitry 42 can couple the first voltage output 24 of the first tracker circuitry 18 to the supply voltage input 16, thus providing the first modulated voltage $V_{CCA}$ to the unlicensed band amplifier circuit 12 as the supply voltage $V_{SUP}$. Alternatively, the control circuitry 42 can couple the second voltage output 30 of the second tracker circuitry 20 to the supply voltage input 16, thus providing the second modulated voltage $V_{CCB}$ to the unlicensed band amplifier circuit 12 as the supply voltage $V_{SUP}$. Further, the first tracker circuitry 18 or the second tracker circuitry 20 can be configured to generate the first modulated voltage $V_{CCA}$ or the second modulated voltage $V_{CCB}$ as the ET modulate voltage, thus enabling the unlicensed band amplifier circuit 12 to operate with maximum efficiency in the first transmission mode.

In the second transmission mode, the control circuitry 42 may couple a selected supply voltage output of the supply voltage circuitry 34 to the supply voltage input 16 to provide a selected supply voltage among the first supply voltage $V_{batampA}$, the second supply voltage $V_{batampB}$, and the third supply voltage $V_{batampC}$ to the unlicensed band amplifier circuit 12. In a non-limiting example, in the second transmission mode, the control circuitry 42 couples the third supply voltage output 40 to the supply voltage input 16 to provide the third supply voltage $V_{batampC}$ to the unlicensed band amplifier circuit 12 as the supply voltage $V_{SUP}$. Notably, in the second transmission mode, it may also be possible to couple the first voltage output 24 of the first tracker circuitry 18 or the second voltage output 30 of the second tracker circuitry 20 to the supply voltage input 16 of the unlicensed band amplifier circuit 12. As a result, the unlicensed band amplifier circuit 12 may operate based on an ET modulated supply voltage in the second transmission mode.

In this regard, it is possible to dynamically configure the unlicensed band amplifier circuit 12 to support the first transmission mode (eLAA transmission) and the second transmission mode (WiFi-5G transmission) by providing different supply voltages $V_{SUP}$ to the supply voltage input 16 of the unlicensed band amplifier circuit 12. Given that the different supply voltages $V_{SUP}$ can all be provided by dynamically controlling the supply voltage circuitry 34, the multi-mode power management circuit 10 is able to support convergence of the eLAA and the WiFi-5G communications without suffering significant size penalty. Furthermore, as discussed later, the supply voltage circuitry 34 can also be dynamically configured to support a variety of LTE transmissions, either concurrently or non-concurrently, in a variety of licensed RF bands. As such, the multi-mode power management circuit 10 can further support eLAA, WiFi-5G, and LTE convergence in a mobile device without compromising power management efficiency.

The multi-mode power management circuit 10 includes voltage switching circuitry 44. In a non-limiting example, the voltage switching circuitry 44 includes switches $S_A$, $S_B$, and $S_C$ that can be controlled by the control circuitry 42 to selectively couple the unlicensed band amplifier circuit 12 to the first voltage output 24 of the first tracker circuitry 18, the second voltage output 30 of the second tracker circuitry 20, or the third supply voltage output 40 of the supply voltage circuitry 34. It should be appreciated that the voltage switching circuitry 44 can be supported by any type, number, and/or configuration layout of switches without altering functionality of the voltage switching circuitry 44.

In the first transmission mode, the control circuitry 42 may close switch $S_A$, while opening switches $S_B$ and $S_C$, to couple the first voltage output 24 to the supply voltage input 16 and provide the first modulated voltage $V_{CCA}$ as the supply voltage $V_{SUP}$ to the unlicensed band amplifier circuit 12. Alternatively, the control circuitry 42 may close switch $S_B$, while opening switches $S_A$ and $S_C$, to couple the second voltage output 30 to the supply voltage input 16 and provide the second modulated voltage $V_{CCB}$ as the supply voltage $V_{SUP}$ to the unlicensed band amplifier circuit 12. In the second transmission mode, the control circuitry 42 may close switch $S_C$, while opening switches $S_A$ and $S_B$, to couple the third supply voltage output 40 to the supply voltage input 16 and provide the third supply voltage $V_{batampc}$ as the supply voltage $V_{SUP}$ to the unlicensed band amplifier circuit 12.

The multi-mode power management circuit 10 may include one or more first licensed band amplifier circuits 46(1)-46(M) and one or more second licensed band amplifier circuits 48(1)-48(N). In a non-limiting example, the first licensed band amplifier circuits 46(1)-46(M) include an LTE mid-low-band (MLB) amplifier circuit 50 and an LTE ultra-high-band (UHB) amplifier circuit 52, which can be configured to function as an LTE fifth-generation new-radio (5G-NR) amplifier circuit. In another non-limiting example, the second licensed band amplifier circuits 48(1)-48(N) include an LTE high-band (HB) amplifier circuit 54 and an LTE mid-band (MB) amplifier circuit 56. In examples discussed herein, the LTE MLB amplifier circuit 50 is configured to amplify the RF signal 14 for transmission in licensed LTE MLB between 1700-1900 MHz, the MB amplifier circuit 56 is configured to amplify the RF signal 14 for transmission in licensed LTE MB between 1950-2200 MHz, the LTE HB amplifier circuit 54 is configured to amplify the RF signal 14 for transmission in licensed LTE HB between 2300-2700 MHz, and the LTE UHB amplifier circuit 52 is configured to amplify the RF signal 14 for transmission in licensed LTE UHB above 3400 MHz. Each of the MLB, the MB, the HB, and the ULB can be used as an anchor band of the eLAA band.

In this regard, in the first transmission mode, the multi-mode power management circuit 10 can support uplink carrier aggregation (ULCA) between the eLAA band and any of the LTE MLB, the LTE MB, the LTE HB, and the LTE UHB. In one example, when the control circuitry 42 couples the first voltage output 24 of the first tracker circuitry 18 to the supply voltage input 16 of the unlicensed band amplifier circuit 12, the second tracker circuitry 20 can be configured (e.g., by opening the switch $S_B$) to provide the second modulated voltage $V_{CCB}$ to the LTE HB amplifier circuit 54 and/or the LTE MB amplifier circuit 56. As a result, the RF signal 14 can be transmitted concurrently in the eLAA band as well as the LTE HB and/or the LTE MB. In another example, when the control circuitry 42 couples the second voltage output 30 of the second tracker circuitry 20 to the supply voltage input 16 of the unlicensed band amplifier circuit 12, the first tracker circuitry 18 can be configured (e.g., by opening the switch $S_A$) to provide the first modulated voltage $V_{CCA}$ to the LTE MLB amplifier circuit 50 and/or the LTE UHB amplifier circuit 52. As a result, the RF signal 14 can be transmitted concurrently in the eLAA band as well as the LTE MLB and/or the LTE UHB.

Alternatively, when the RF signal 14 needs to be transmitted in the eLAA band with increased peak power and the multi-mode power management circuit 10 is not required to support ULCA, the control circuitry 42 may opportunistically configure the first tracker circuitry 18 to provide the first modulated voltage $V_{CCA}$ to the second tracker circuitry 20, or configure the second tracker circuitry 20 to provide the second modulated voltage $V_{CCB}$ to the first tracker circuitry 18.

In one example, when the first voltage output 24 of the first tracker circuitry 18 is coupled to the supply voltage input 16 of the unlicensed band amplifier circuit 12 in the first transmission mode and when the RF signal 14 is not transmitted in the LTE HB and the LTE MB, the second tracker circuitry 20 will not be used. As such, the control circuitry 42 may opportunistically couple the second voltage output 30 to the first bias voltage input 26 to provide the second modulated voltage $V_{CCB}$ to the first tracker circuitry 18.

In another example, when the second voltage output 30 of the second tracker circuitry 20 is coupled to the supply voltage input 16 of the unlicensed band amplifier circuit 12 in the first transmission mode and when the RF signal 14 is not transmitted in the LTE MLB and the LTE UHB, the first tracker circuitry 18 will not be used. As such, the control circuitry 42 may opportunistically couple the first voltage output 24 to the second bias voltage input 32 to provide the first modulated voltage $V_{CCA}$ to the second tracker circuitry 20.

In a non-limiting example, the supply voltage circuitry 34 can include switching circuitry 58 that includes switches $S_1$ and $S_2$. In this regard, to couple the first voltage output 24 to the second bias voltage input 32, the control circuitry 42 may close switch $S_1$, while keeping switch $S_2$ open. In contrast, to couple the second voltage output 30 to the first bias voltage input 26, the control circuitry 42 may close switch $S_2$, while keeping switch $S_1$ open.

In the second transmission mode, the multi-mode power management circuit 10 can be configured to concurrently support ULCA between the LTE MLB or the LTE UHB and the LTE HB or the LTE MB. For example, the control circuitry 42 can close switch $S_C$ to couple the third supply voltage output 40 to the supply voltage input 16, while keeping switches $S_A$ and $S_B$ open. Synchronously or asynchronously, the control circuitry 42 can open the switches $S_1$ and $S_2$. The control circuitry 42 can further couple the first bias voltage input 26 and the second bias voltage input 32 to the first supply voltage output 36 and the second supply voltage output 38 to receive the first bias voltage $V_{batampA}$ and the second bias voltage $V_{batampB}$, respectively. As such, the first tracker circuitry 18 can provide the first modulated voltage $V_{CCA}$ to the LTE MLB amplifier circuit 50 and the second tracker circuitry 20 can provide the second modulated voltage $V_{CCB}$ to the LTE HB amplifier circuit 54. As a result, the multi-mode power management circuit 10 can be configured to support WiFi-5G and ULCA between the LTE MLB and the LTE HB. Notably, the multi-mode power management circuit 10 can also be configured to support WiFi-5G and ULCA between the LTE MLB and the LTE MB, or ULCA between the LTE UHB and the LTE HB, or ULCA between the LTE UHB and the LTE MB in similar fashion.

In the second transmission mode, the control circuitry 42 may also couple the first voltage output 24 of the first tracker circuitry 18 to the supply voltage input 16 of the unlicensed band amplifier circuit 12 to amplify the RF signal 14 for transmission in the WiFi-5G band. To do so, the control circuitry 42 may close switch $S_A$, while opening switches $S_B$, $S_C$, and $S_1$. The control circuitry may close switch $S_2$ to couple the second voltage output 30 of the second tracker circuitry 20 to the first bias voltage input 26, thus providing the second modulated voltage $V_{CCB}$ to the first tracker circuitry 18. Alternatively, the control circuitry 42 may open switch $S_2$ and keep the first bias voltage input 26 coupled to the first supply voltage output 36.

Likewise, in the second transmission mode, the control circuitry 42 may also couple the second voltage output 30 of the second tracker circuitry 20 to the supply voltage input 16 of the unlicensed band amplifier circuit 12 to amplify the RF signal 14 for transmission in the WiFi-5G band. To do so, the control circuitry 42 may close switch $S_B$, while opening switches $S_A$, $S_C$, and $S_2$. The control circuitry may close switch $S_1$ to couple the first voltage output 24 of the first tracker circuitry 18 to the second bias voltage input 32, thus providing the first modulated voltage $V_{CCA}$ to the second tracker circuitry 20. Alternatively, the control circuitry 42 may open switch $S_1$ and keep the second bias voltage input 32 coupled to the second supply voltage output 38.

Figure 2:
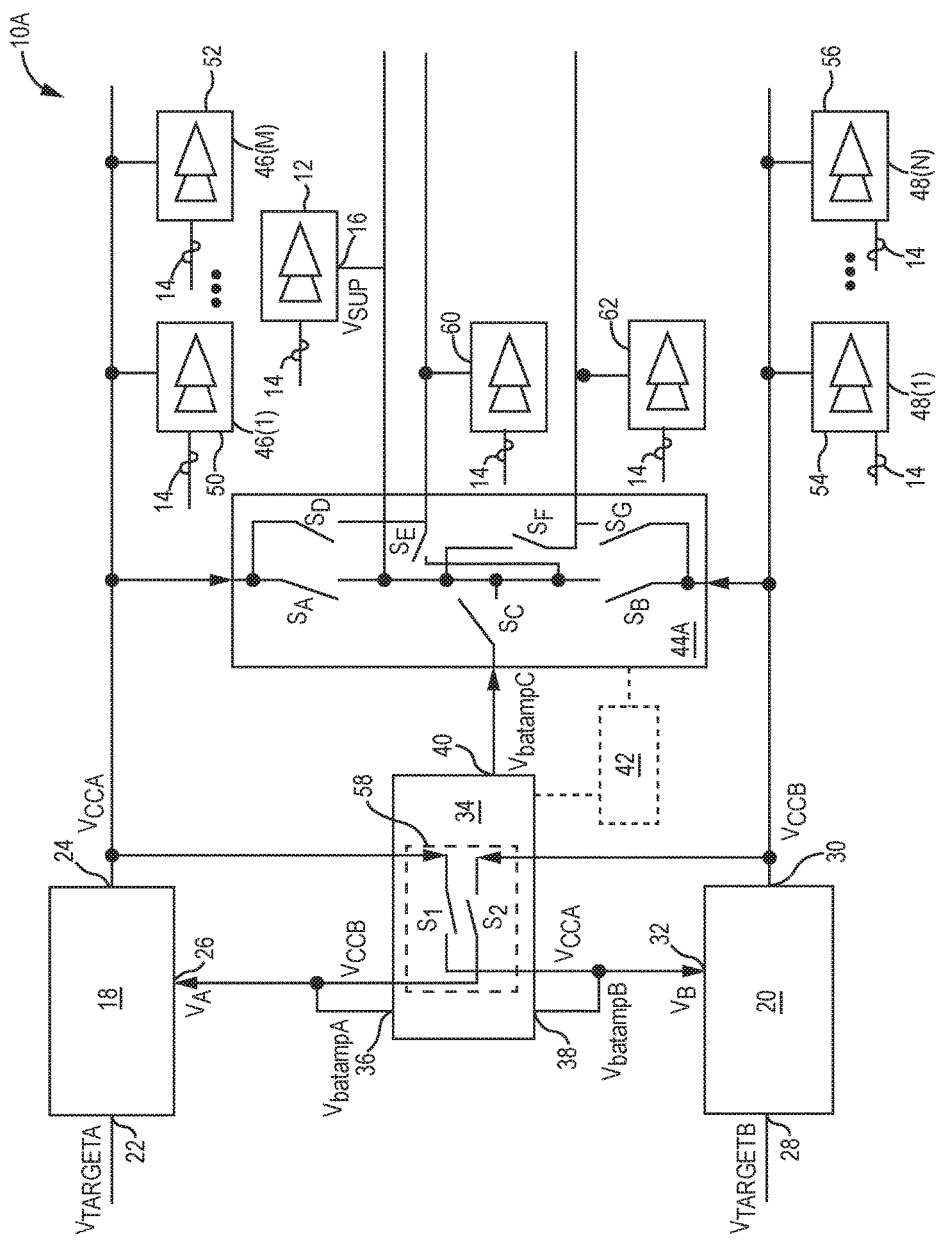
FIG. 2 is a schematic diagram of an exemplary multi-mode power management circuit according to an alternative embodiment of the present disclosure.

The multi-mode power management circuit 10 may be configured to include additional licensed band amplifier circuits, such as LTE low-band (LB) amplifier circuits. In this regard, FIG. 2 is a schematic diagram of an exemplary multi-mode power management circuit 10A according to an alternative embodiment of the present disclosure. Common elements between FIGS. 1 and 2 are shown therein with common element numbers and will not be re-described herein.

The multi-mode power management circuit 10A includes at least one LTE LB amplifier circuit 60 configured to amplify the RF signal 14 for transmission in an LTE licensed LB between 450-960 MHz. The multi-mode power management circuit 10A may also include at least one second-generation (2G) amplifier circuit 62 configured to amplify the RF signal 14 for transmission in licensed 2G RF bands.

The multi-mode power management circuit 10A includes voltage switching circuitry 44A, which further includes switches $S_D$, $S_E$, $S_F$, and $S_G$ in addition to the switches $S_A$, $S_B$, and $S_C$. Notably, the switches $S_A$-$S_G$ in FIG. 2 are merely for the purpose of illustration and should now be regarded as being limiting.

The control circuitry 42 may couple the LTE LB amplifier circuit 60 to the first voltage output 24 by closing switch $S_D$, while keeping all other switches in the voltage switching circuitry 44A open. The control circuitry 42 may couple the LTE LB amplifier circuit 60 to the second voltage output 30 by closing switches $S_B$ and $S_E$, while keeping all other switches in the voltage switching circuitry 44A open. The control circuitry 42 may couple the 2G amplifier circuit 62 to the first voltage output 24 by closing switches $S_A$ and $S_F$, while keeping all other switches in the voltage switching circuitry 44A open. The control circuitry 42 may couple the 2G amplifier circuit 62 to the second voltage output 30 by closing switch $S_G$, while keeping all other switches in the voltage switching circuitry 44A open. Notably, the control circuitry 42 may configure the LTE LB amplifier circuit 60 and/or the 2G amplifier circuit 62 to operate concurrently to the unlicensed band amplifier circuit 12 based on similar configuration principles as described above in FIG. 1.

As previously mentioned in FIG. 1, the first supply voltage $V_{batampA}$, the second supply voltage $V_{batampB}$, and the third supply voltage $V_{batampC}$ can either be independently or concurrently generated at various voltage levels according to various usage scenarios. Two embodiments of the supply voltage circuitry 34 as provided in FIGS. 1 and 2 are discussed with references to FIGS. 3 and 4, respectively.

Figure 3:
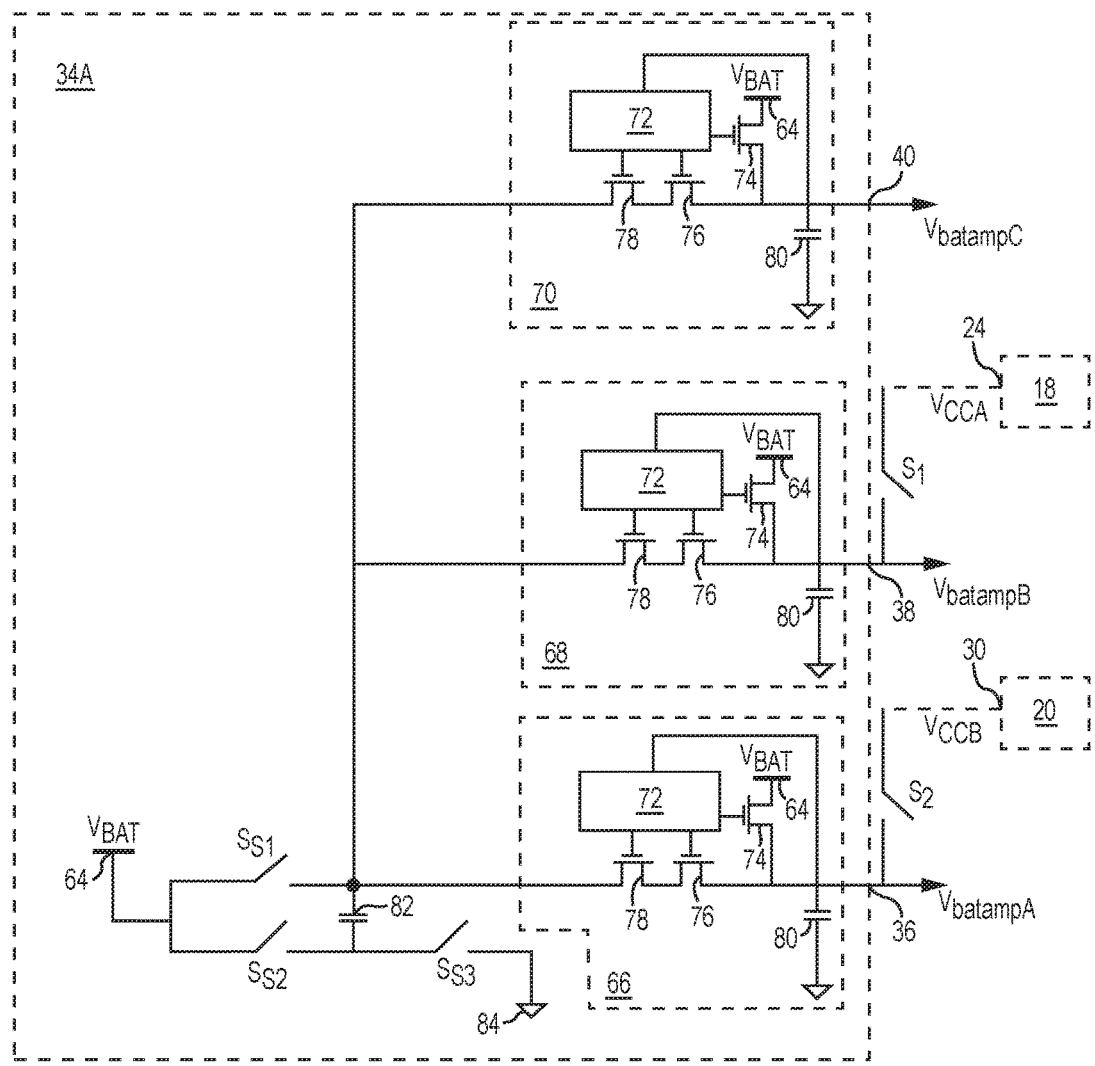
FIG. 3 is a schematic diagram of an exemplary supply voltage circuitry that can be provided in the multi-mode power management circuit of FIGS. 1 and 2.

In this regard, FIG. 3 is a schematic diagram of an exemplary supply voltage circuitry 34A that can be provided in the multi-mode power management circuit 10 of FIG. 1 and the multi-mode power management circuit 10A of FIG. 2 as the supply voltage circuitry 34. Common elements between FIGS. 1, 2, and 3 are shown therein with common element numbers and will not be re-described herein.

The supply voltage circuitry 34A includes a battery 64 configured to provide a defined battery voltage $V_{Bat}$. The supply voltage circuitry 34A includes first voltage control circuitry 66, second voltage control circuitry 68, and third voltage control circuitry 70 configured to be coupled to the first supply voltage output 36, the second supply voltage output 38, and the third supply voltage output 40, respectively. In a non-limiting example, each of the first voltage control circuitry 66, the second voltage control circuitry 68, and the third voltage control circuitry 70 includes a respective low dropout regulator (LDO) 72, a respective first transistor 74, a respective second transistor 76, a respective third transistor 78, and a respective capacitor 80.

The first voltage control circuitry 66, the second voltage control circuitry 68, and the third voltage control circuitry 70 may be independently controlled to generate the first supply voltage $V_{batampA}$, the second supply voltage $V_{batampB}$, and the third supply voltage $V_{batampC}$, respectively. Depending on specific usage scenarios, each of the first supply voltage $V_{batampA}$, the second supply voltage $V_{batampB}$, and the third supply voltage $V_{batampC}$ can be independently generated to be below the defined battery voltage $V_{Bat}$, equal to the defined battery voltage $V_{Bat}$, or up to two times the defined battery voltage $V_{Bat}$ ($2 \times V_{Bat}$).

The supply voltage circuitry 34A includes a fly capacitor 82, switches $S_{S1}$, $S_{S2}$, and $S_{S3}$ disposed between the battery 64 and a ground 84 as shown in FIG. 3. To enable any of the first voltage control circuitry 66, the second voltage control circuitry 68, and the third voltage control circuitry 70 to output the first supply voltage $V_{batampA}$, the second supply voltage $V_{batampB}$, and the third supply voltage $V_{batampC}$ at up to two times the defined battery voltage $V_{Bat}$, the switches $S_{S1}$ and $S_{S3}$ are first closed to charge the fly capacitor 82 to the defined battery voltage $V_{Bat}$. Once the fly capacitor 82 is charged to the defined battery voltage $V_{Bat}$, the switch $S_{S2}$ is closed while the switches $S_{S1}$ and $S_{S3}$ are opened. As a result, the battery 64 and the fly capacitor 82 can enable any of the first voltage control circuitry 66, the second voltage control circuitry 68, and the third voltage control circuitry 70 to output the first supply voltage $V_{batampA}$, the second supply voltage $V_{batampB}$, and the third supply voltage $V_{batampC}$ at up to two times the defined battery voltage $V_{Bat}$.

Figure 4:
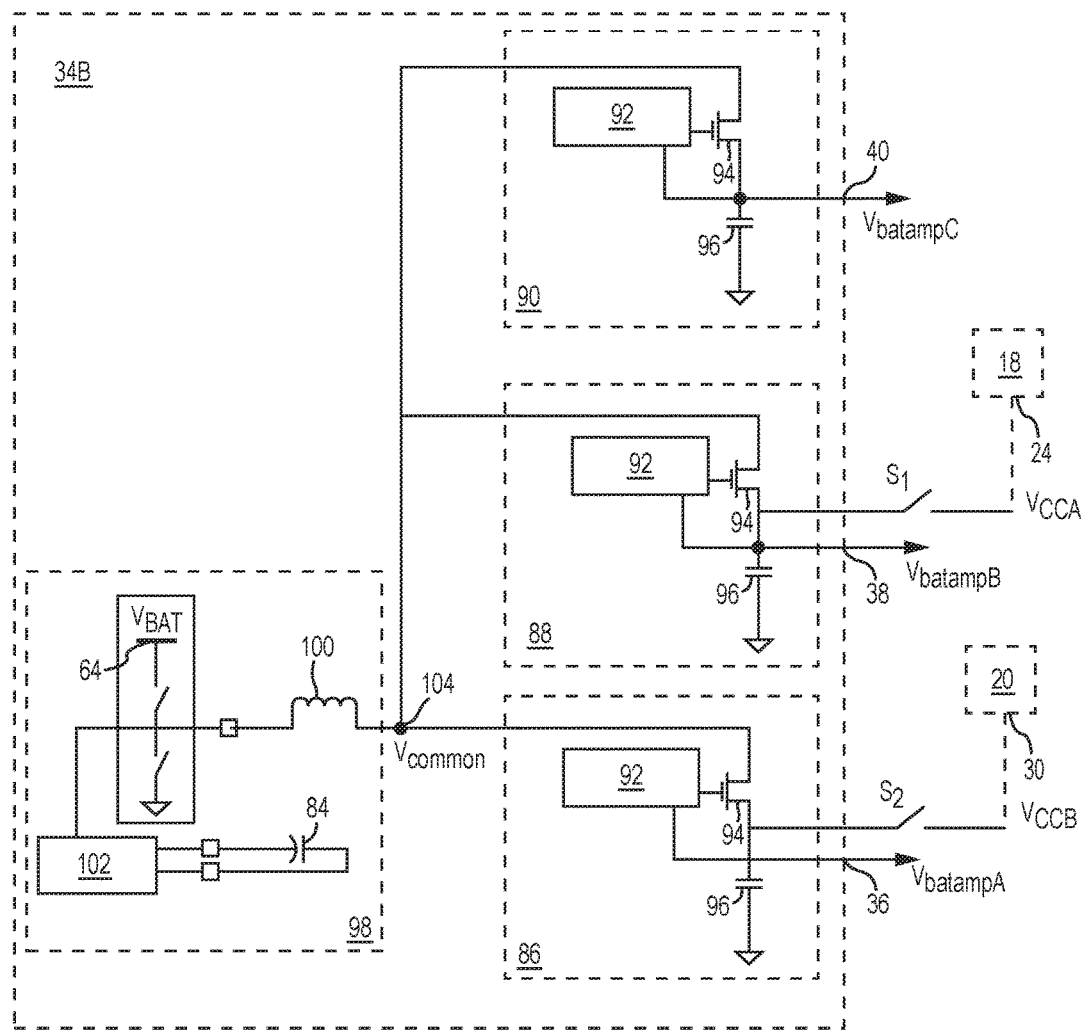
FIG. 4 is a schematic diagram of another exemplary supply voltage circuitry that can be provided in the multi-mode power management circuit of FIGS. 1 and 2.

FIG. 4 is a schematic diagram of an exemplary supply voltage circuitry 34B that can be provided in the multi-mode power management circuit 10 of FIG. 1 and the multi-mode power management circuit 10A of FIG. 2 as the supply voltage circuitry 34. Common elements between FIGS. 1, 2, 3, and 4 are shown therein with common element numbers and will not be re-described herein.

The supply voltage circuitry 34B includes first voltage control circuitry 86, second voltage control circuitry 88, and third voltage control circuitry 90 configured to be coupled to the first supply voltage output 36, the second supply voltage output 38, and the third supply voltage output 40, respectively. In a non-limiting example, each of the first voltage control circuitry 86, the second voltage control circuitry 88, and the third voltage control circuitry 90 includes a respective low dropout regulator (LDO) 92, a respective transistor 94, and a respective capacitor 96.

The supply voltage circuitry 34B includes voltage generation circuitry 98. The voltage generation circuitry 98 includes an inductor 100 and buck-boost circuitry 102. The voltage generation circuitry 98 is configured to generate a voltage $V_{COMMON}$ at a coupling point 104. The voltage generation circuitry 98 may generate the voltage $V_{COMMON}$ to be below the defined battery voltage $V_{Bat}$, equal to the defined battery voltage $V_{Bat}$, or up to two times the defined battery voltage $V_{Bat}$ ($2 \times V_{Bat}$). The voltage $V_{COMMON}$ is outputted concurrently from the first supply voltage output 36, the second supply voltage output 38, and the third supply voltage output 40 as the first supply voltage $V_{batampA}$, the second supply voltage $V_{batampB}$, and the third supply voltage $V_{batampC}$.

Those skilled in the art will recognize improvements and modifications to the preferred embodiments of the present disclosure. All such improvements and modifications are considered within the scope of the concepts disclosed herein and the claims that follow.

What is claimed is:

1. A multi-mode power management circuit comprising:
an unlicensed band amplifier circuit comprising a supply voltage input and configured to amplify a radio frequency (RF) signal for transmission in at least one unlicensed RF band based on a supply voltage received at the supply voltage input;
first tracker circuitry comprising a first voltage output and configured to generate a first modulated voltage at the first voltage output;
second tracker circuitry comprising a second voltage output and configured to generate a second modulated voltage at the second voltage output;
supply voltage circuitry comprising a plurality of supply voltage outputs configured to output a plurality of supply voltages, respectively; and
control circuitry configured to support a first transmission mode and a second transmission mode, wherein:
in the first transmission mode, the control circuitry is further configured to couple a selected voltage output among the first voltage output and the second voltage output to the supply voltage input to provide a selected modulated voltage among the first modulated voltage and the second modulated voltage to the unlicensed band amplifier circuit; and
in the second transmission mode, the control circuitry is further configured to couple a selected supply voltage output among the plurality of supply voltage outputs to the supply voltage input to provide a selected supply voltage among the plurality of supply voltages to the unlicensed band amplifier circuit.

2. The multi-mode power management circuit of claim 1 wherein the unlicensed band amplifier circuit is further configured to:
amplify the RF signal based on the selected modulated voltage received at the supply voltage input for transmission in an enhanced licensed assisted access (eLAA) band in the first transmission mode; and
amplify the RF signal based on the selected supply voltage received at the supply voltage input for transmission in a Wi-Fi 5 GHz (WiFi-5G) band in the second transmission mode.

3. The multi-mode power management circuit of claim 2 wherein the eLAA band comprises long-term evolution (LTE) band 46.

4. The multi-mode power management circuit of claim 1 wherein the selected modulated voltage is an envelope tracking (ET) modulated voltage.

5. The multi-mode power management circuit of claim 1 wherein:
the first tracker circuitry further comprises a first voltage input configured to receive a first target voltage and a first bias voltage input configured to receive a first bias voltage, wherein the first tracker circuitry is further configured to generate the first modulated voltage tracking the first target voltage based on the first bias voltage; and
the second tracker circuitry further comprises a second voltage input configured to receive a second target voltage and a second bias voltage input configured to receive a second bias voltage, wherein the second tracker circuitry is further configured to generate the second modulated voltage tracking the second target voltage based on the second bias voltage.

6. The multi-mode power management circuit of claim 5 further comprising:
one or more first licensed band amplifier circuits coupled to the first voltage output of the first tracker circuitry; and
one or more second licensed band amplifier circuits coupled to the second voltage output of the second tracker circuitry.

7. The multi-mode power management circuit of claim 6 wherein:
the one or more first licensed band amplifier circuits comprise a long-term evolution (LTE) mid-low-band (MLB) amplifier circuit and an LTE ultra-high-band (UHB) amplifier circuit; and
the one or more second licensed band amplifier circuits comprise an LTE high-band (HB) amplifier circuit and an LTE mid-band (MB) amplifier circuit.

8. The multi-mode power management circuit of claim 6 wherein the supply voltage circuitry comprises:
a first supply voltage output configured to output a first supply voltage;
a second supply voltage output configured to output a second supply voltage; and
a third supply voltage output configured to output a third supply voltage.

9. The multi-mode power management circuit of claim 8 wherein the supply voltage circuitry further comprises:
a battery configured to provide a defined battery voltage;
first voltage control circuitry coupled to the first supply voltage output, the first voltage control circuitry configured to generate the first supply voltage to be below the defined battery voltage, equal to the defined battery voltage, or up to two times the defined battery voltage;
second voltage control circuitry coupled to the second supply voltage output, the second voltage control circuitry configured to generate the second supply voltage to be below the defined battery voltage, equal to the defined battery voltage, or up to two times the defined battery voltage; and
third voltage control circuitry coupled to the third supply voltage output, the third voltage control circuitry configured to generate the third supply voltage to be below the defined battery voltage, equal to the defined battery voltage, or up to two times the defined battery voltage;
wherein:
the first voltage control circuitry is further configured to generate the first supply voltage independent from the second voltage control circuitry and the third voltage control circuitry;
the second voltage control circuitry is further configured to generate the second supply voltage independent from the first voltage control circuitry and the third voltage control circuitry; and
the third voltage control circuitry is further configured to generate the third supply voltage independent from the first voltage control circuitry and the second voltage control circuitry.

10. The multi-mode power management circuit of claim 8 wherein the supply voltage circuitry further comprises:
a battery configured to provide a defined battery voltage; and
voltage generation circuitry configured to generate the first supply voltage, the second supply voltage, and the third supply voltage concurrently.

11. The multi-mode power management circuit of claim 8 further comprising voltage switching circuitry configured to selectively couple the unlicensed band amplifier circuit to the first voltage output of the first tracker circuitry, the second voltage output of the second tracker circuitry, or the third supply voltage output of the supply voltage circuitry.

12. The multi-mode power management circuit of claim 11 wherein, in the first transmission mode, the control circuitry is further configured to control the voltage switching circuitry to couple the first voltage output to the supply voltage input to provide the first modulated voltage to the unlicensed band amplifier circuit.

13. The multi-mode power management circuit of claim 12 wherein, in the first transmission mode, the second tracker circuitry is configured to provide the second modulated voltage to the first bias voltage input of the first tracker circuitry.

14. The multi-mode power management circuit of claim 12 wherein, in the first transmission mode, the second tracker circuitry is configured to provide the second modulated voltage to the one or more second licensed band amplifier circuits.

15. The multi-mode power management circuit of claim 11 wherein, in the first transmission mode, the control circuitry is further configured to control the voltage switching circuitry to couple the second voltage output to the supply voltage input to provide the second modulated voltage to the unlicensed band amplifier circuit.

16. The multi-mode power management circuit of claim 15 wherein, in the first transmission mode, the first tracker circuitry is configured to provide the first modulated voltage to the second bias voltage input of the second tracker circuitry.

17. The multi-mode power management circuit of claim 15 wherein, in the first transmission mode, the first tracker circuitry is configured to provide the first modulated voltage to the one or more first licensed band amplifier circuits.

18. The multi-mode power management circuit of claim 11 wherein, in the second transmission mode, the control circuitry is further configured to control the voltage switching circuitry to couple the third supply voltage output to the supply voltage input to provide the third supply voltage to the unlicensed band amplifier circuit.

19. The multi-mode power management circuit of claim 11 wherein, in the second transmission mode, the control circuitry is further configured to control the voltage switching circuitry to couple the first voltage output of the first tracker circuitry to the supply voltage input to provide the first modulated voltage to the unlicensed band amplifier circuit.

20. The multi-mode power management circuit of claim 11 wherein, in the second transmission mode, the control circuitry is further configured to control the voltage switching circuitry to couple the second voltage output of the second tracker circuitry to the supply voltage input to provide the second modulated voltage to the unlicensed band amplifier circuit.

* * * * *

UNITED STATES PATENT AND TRADEMARK OFFICE
CERTIFICATE OF CORRECTION

PATENT NO. : 10,103,926 B1
APPLICATION NO. : 15/825562
DATED : October 16, 2018
INVENTOR(S) : Nadim Khlat Page 1 of 1

It is certified that error appears in the above-identified patent and that said Letters Patent is hereby corrected as shown below:

In the Specification

In Column 5, Lines 41 and 44, replace "voltage $V_{batampc}$" with --voltage $V_{batampC}$--.

In Column 6, Line 14, replace "voltage $V_{batampc}$" with --voltage $V_{batampC}$--.

In Column 7, Line 4, replace "$V_{batampc}$" with --$V_{batampC}$--.

In Column 10, Lines 12, 15, 25, and 35, replace "voltage $V_{batampc}$" with --voltage $V_{batampC}$--.

In Column 10, Line 67, replace "$V_{batampc}$" with --$V_{batampC}$--.

Signed and Sealed this
Eleventh Day of December, 2018

Andrei Iancu
*Director of the United States Patent and Trademark Office*